(12) United States Patent
Ren et al.

(10) Patent No.: US 11,972,963 B2
(45) Date of Patent: Apr. 30, 2024

(54) WAFER TRANSFER MODULE AND METHOD THEREOF FOR TRANSFERRING TO-BE-TRANSFERRED WAFER

(71) Applicant: Shanghai Huali Integrated Circuit Corporation, Shanghai (CN)

(72) Inventors: Yu Ren, Shanghai (CN); Jin Xu, Shanghai (CN); Kaiqu Ang, Shanghai (CN); Zaifeng Tang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 409 days.

(21) Appl. No.: 17/472,919

(22) Filed: Sep. 13, 2021

(65) Prior Publication Data

US 2022/0139749 A1  May 5, 2022

(30) Foreign Application Priority Data

Nov. 2, 2020  (CN) .......................... 202011201852.9

(51) Int. Cl.
*H01L 21/677* (2006.01)
*B65G 43/10* (2006.01)
*G05B 19/418* (2006.01)
*H01L 21/68* (2006.01)

(52) U.S. Cl.
CPC ........ *H01L 21/67712* (2013.01); *B65G 43/10* (2013.01); *G05B 19/4189* (2013.01); *H01L 21/68* (2013.01); *G05B 2219/45032* (2013.01)

(58) Field of Classification Search
CPC ...... G05B 19/4189; G05B 2219/45032; H01L 21/67712; H01L 21/68; H01L 21/67265; H01L 21/67778; H04W 24/08; H04W 4/02; H04W 56/0005; H04W 56/004; H04W 56/0045; H04W 56/0065; H04W 64/00; H04W 64/003; H04W 8/08
USPC .................................................. 700/13, 213
See application file for complete search history.

(56) References Cited

U.S. PATENT DOCUMENTS

| 4,644,172 A | * | 2/1987 | Sandland | ......... G01N 21/95607 250/548 |
| 6,208,909 B1 | * | 3/2001 | Kato | ................. H01L 21/67778 414/331.14 |
| 6,223,096 B1 | * | 4/2001 | Nam | ................. H01L 21/67098 414/935 |

(Continued)

FOREIGN PATENT DOCUMENTS

KR         2010069893 A  *  6/2010  ....... H01L 21/67265

*Primary Examiner* — Chun Cao
(74) *Attorney, Agent, or Firm* — Banner & Witcoff, Ltd.

(57) ABSTRACT

The present application relates to a wafer transfer module in a semiconductor manufacturing machine, relating to semiconductor integrated circuit manufacturing machines, wherein two sets of transmitter/receivers are provide on sidewalls of the wafer transfer module to monitor the travel position of an elevator, two sets of transmitter/receivers are provide on the sidewalls of the wafer transfer module to monitor the position of a transfer arm, a signal received by the receiver is transmitted to a control system such that the control system determines, according to the travel position of the elevator and the transfer arm position, whether the transfer arm can obtain a to-be-transferred wafer, thereby preventing the problem of a wafer scratch caused by an elevator position deviation or a transfer arm position deviation.

6 Claims, 6 Drawing Sheets

(56) References Cited

U.S. PATENT DOCUMENTS

| | | | |
|---|---|---|---|
| 7,172,383 B2* | 2/2007 | Fujii | H01L 21/67781 414/811 |
| 2010/0185305 A1* | 7/2010 | Lin | H01L 21/67265 901/50 |
| 2016/0111311 A1* | 4/2016 | Lee | H01L 21/67259 700/213 |

* cited by examiner

WAFER TRANSFER MODULE AND METHOD THEREOF FOR TRANSFERRING TO-BE-TRANSFERRED WAFER

CROSS REFERENCE TO RELATED APPLICATIONS

The present application claims priority to and the benefit of Chinese Patent Application No. 202011201852.9 filed on Nov. 2, 2020, the disclosure of which is incorporated herein by reference in its entirety as part of the present application.

TECHNICAL FIELD

The present application relates to semiconductor integrated circuit manufacturing machines, in particular to a wafer transfer module in a semiconductor manufacturing machine.

BACKGROUND

With the development of semiconductor technologies, the manufacturing integration is increased, and the size of wafers is gradually increased from 4" and 5" to 12" or even 18" and other larger sizes. In addition, the cost of producing a single wafer is rapidly reduced, and the number of wafers produced by a device per unit time is rapidly increased.

The number of wafers produced per unit time is related to both process time and transfer time of wafers. In an example, a dry-etching photoresist removal machine is used, the photoresist removal time for each wafer is short, i.e., about 20 seconds, but the time required to transfer the wafer is long, i.e., about 10 to 20 seconds; therefore, the optimization of the transfer mode is an effective way to improve the production efficiency.

FIG. 1 is a structural schematic diagram of a conventional single wafer transfer-photoresist removal machine, which operates in a single wafer transfer mode. Specifically, each wafer 100 is transferred from a first loadport 210 to a first transfer station 310 and undergoes a pumpdown/vent action; then the wafer 100 is transferred to a process chamber 400 and undergoes a photoresist removal process; then the wafer 100 is transferred to a second transfer station 320 and undergoes a pumpdown/vent action; and finally, the wafer 100 is transferred to a second loadport 220 and then leaves the photoresist removal machine. In an example, for each wafer, a transfer time from entering into the process chamber 400 to leaving from the process chamber 400 is 15 seconds, and a process time is 20 seconds; therefore, the total time required for 25 wafers to complete the photoresist removal process is about 1250 seconds, wherein the transfer time is 25*15 seconds*2=750 seconds, and the process time is 25*20 seconds=500 seconds. It can be seen from above that the transfer time occupies a very large proportion.

In order to solve the problem of a relatively long transfer time for single wafer transfer shown in FIG. 1, an integrated wafer transfer-photoresist removal machine emerges. FIG. 2 is a structural schematic diagram of a conventional integrated wafer transfer-photoresist removal machine, which operates in a mode in which a whole batch of 25 wafers is transferred at one time. Specifically, a whole batch of 25 wafers 100 is moved from the first loadport 210 into a first transfer module 510 at one time and is generally moved into the first transfer module 510 at one time by means of an elevator, and undergoes a pumpdown/vent action; then all the wafers are sequentially transferred from the first transfer module 510 to the process chamber 400, undergo a photoresist removal process, are respectively moved into a second transfer module 520 after the photoresist removal process, and undergo a pumpdown/vent action as a whole in the second transfer module 520; and then the wafers are moved out from the second transfer module 520 to the second loadport 220 at one time and are generally moved out from the second transfer module 520 at one time by means of an elevator. Compared with the mode shown in FIG. 1, the process time remains unchanged, while the transfer time for 25 wafers is greatly reduced, thereby increasing the number of wafers produced per unit time by about 2.2 times, that is, the efficiency is increased by about 2.2 times.

However, with the significant increase in the production efficiency, large-scale mass production of wafers is implemented, and the stability of a device in each step of integrated wafer transfer is required to be higher, otherwise, the number of wafers suffering from a wafer transfer problem (such as a wafer scratch problem) may increase with the increase in the production efficiency. Therefore, it is very important to improve the stability of the device in each step of integrated wafer transfer.

Referring to FIG. 2, in the integrated wafer transfer-photoresist removal machine, all the wafers are sequentially transferred from the first transfer module 510 to the process chamber 400 by means of a transfer arm, and after the process is completed, each wafer is respectively moved from the process chamber 400 into the second transfer module 520. Generally, the position of the transfer arm is fixed, a to-be-transferred wafer is moved by vertically moving the positions of the elevators in the first transfer module 510 and in the second transfer module 520. However, if there is a deviation in the position of the vertically moved elevator, the transfer arm may scratch the to-be-transferred wafer or a wafer adjacent to the to-be-transferred wafer. Specifically, please refer to FIGS. 3a-3c. FIGS. 3a-3c are schematic diagrams of a relative positional relationship between the elevator and the transfer arm in the transfer module during a wafer transfer process. Specifically, taking the first transfer module 510 as an example, the first transfer module 510 includes an elevator 511, the elevator 511 includes an elevator side wall 512 and a plurality of inserts 513, one end of each of the plurality of inserts 513 is fixed to the elevator side wall 512, the other end protrudes from the elevator side wall 512, and a portion protruding from the elevator side wall 512 can carry the wafer 100. Referring to FIG. 3a, during transfer of the to-be-transferred wafer 101, the elevator 511 is moved vertically to a predetermined position. However, if the final position of the elevator 511 is not the predetermined position but is a position higher than the predetermined position as shown in FIG. 3a, the transfer arm 600 may scratch a wafer 102 on the lower side of and adjacent to the to-be-transferred wafer 101; and similarly, referring to FIG. 3b, if the final position of the elevator 511 is not the predetermined position but is a position lower than the predetermined position as shown in FIG. 3b, the transfer arm 600 may scratch the to-be-transferred wafer 101. Referring to FIG. 3c, during the transfer of the to-be-transferred wafer 101, the elevator 511 is moved vertically to the predetermined position, and if the elevator 511 just stops at the predetermined position as shown in FIG. 3c, the transfer arm 600 can transfer the to-be-transferred wafer 101 without scratching the to-be-transferred wafer 101 and the wafer 102 on the lower side of and adjacent to the to-be-transferred wafer 101. The horizontal direction is consistent with the transfer direction of the wafer, and the vertical direction is the direction perpendicular to the horizontal direction.

However, the design for monitoring the vertical position of the elevator is empty, that is, regardless of whether the elevator stops at the predetermined position, the transfer arm 600 operates to transfer the to-be-transferred wafer 101, causing a risk of scratching the wafer. In addition, even if the transfer arm 600 only moves horizontally during operation, generally without vertical deviation, with the increase in the use time of the machine, the transfer arm 600 may undergo a vertical deviation, in which case the transfer arm 600 may scratch the wafer even if the elevator stops at the predetermined position. Therefore, it is particularly important to monitor the vertical positions of the transfer arm and the elevator.

BRIEF SUMMARY

According to embodiments described herein there is provided a wafer transfer module in a semiconductor manufacturing machine, comprising: a first transfer module sidewall and a second transfer module sidewall opposite to the first transfer module sidewall; an elevator located between the first transfer module sidewall and the second transfer module sidewall and used to carry a wafer, wherein the elevator comprises an elevator sidewall and a plurality of inserts, one end of each of the plurality of inserts is fixed to the elevator sidewall and is in an spaced arrangement along a height direction of the elevator sidewall, the other end of each of the plurality of inserts protrudes from the elevator sidewall, a portion protruding from the elevator sidewall carries the wafer, and the height direction of the elevator sidewall is consistent with an extension direction of the first transfer module sidewall and the second transfer module sidewall; a first transmitter and a first receiver, wherein the first transmitter is disposed on the first transfer module sidewall, the first receiver is disposed on the second transfer module sidewall, and the first receiver is positioned opposite the first transmitter such that in a case of no obstruction between the first receiver and the first transmitter, the first receiver can receive a signal transmitted by the first transmitter; a second transmitter and a second receiver, wherein the second transmitter is disposed on the first transfer module sidewall, the second receiver is disposed on the second transfer module sidewall, the second receiver is positioned opposite the second transmitter such that in a case of no obstruction between the second receiver and the second transmitter, the second receiver can receive a signal transmitted by the second transmitter, the first transmitter and the first receiver corresponding thereto and the second transmitter and the second receiver corresponding thereto are used to monitor the position of a to-be-transferred wafer in a vertical direction, and according to a position change of the to-be-transferred wafer in the vertical direction, the first receiver outputs a first wafer position signal E1 and the second receiver outputs a second wafer position signal E2, wherein the position change of the to-be-transferred wafer in the vertical direction is implemented by means of movement of the elevator in the vertical direction; a third transmitter and a third receiver, wherein the third transmitter is disposed on the first transfer module sidewall, the third receiver is disposed on the second transfer module sidewall, and the third receiver is positioned opposite the third transmitter such that in a case of no obstruction between the third receiver and the third transmitter, the third receiver can receive a signal transmitted by the third transmitter; a fourth transmitter and a fourth receiver, wherein the fourth transmitter is disposed on the first transfer module sidewall, the fourth receiver is disposed on the second transfer module sidewall, the fourth receiver is positioned opposite the fourth transmitter such that in a case of no obstruction between the fourth receiver and the fourth transmitter, the fourth receiver can receive a signal transmitted by the fourth transmitter, the third transmitter and the third receiver corresponding thereto and the fourth transmitter and the fourth receiver corresponding thereto are used to monitor the position of a transfer arm used to transfer the wafer in the vertical direction, and according to a position change of the transfer arm in the vertical direction, the third receiver outputs a first transfer arm position signal H1 and the fourth receiver outputs a second transfer arm position signal H2; and a control system that receives the first wafer position signal E1, the second wafer position signal E2, the first transfer arm position signal H1, and the second transfer arm position signal H2 and outputs a transfer arm control signal C according to the first wafer position signal E1, the second wafer position signal E2, the first transfer arm position signal H1, and the second transfer arm position signal H2, to control whether the transfer arm moves to obtain the to-be-transferred wafer, wherein the vertical direction is the height direction of the elevator sidewall.

In an example, the wafer transfer module further comprises a third transfer module sidewall and a fourth transfer module sidewall opposite to the third transfer module sidewall, and the wafer transfer module with a box structure is formed by the first transfer module sidewall, the second transfer module sidewall, the third transfer module sidewall, and the fourth transfer module sidewall.

In an example, if the thickness of the insert is d1, a distance between two adjacent inserts is d2, the thickness of the transfer arm is d3, the thickness of the wafer is d4, and an acceptable vertical tolerance for the position of the transfer arm is h1, then a distance X1 between the third transmitter and the fourth transmitter is d3+2*h1.

In an example, if an acceptable vertical tolerance for the position of the to-be-transferred wafer with respect to a wafer target position S is h2, a distance X2 between the first transmitter and the second transmitter is d4+d1+2*h2, and the wafer target position S is a position where the to-be-transferred wafer can be transferred in the case of no deviation of the transfer arm, without a scratch on the to-be-transferred wafer and on a wafer on a lower side adjacent to the to-be-transferred wafer.

In an example, a distance X3 between the second transmitter and the third transmitter is (d2−d4)/2−d3/2−h1−h2, the first transmitter is located on an upper side of the wafer target position S in the vertical direction, the second transmitter is located on a lower side of the wafer target position S in the vertical direction, the third transmitter is located on an upper side of a predetermined position of the transfer arm in the vertical direction, the fourth transmitter is located on a lower side of the predetermined position of the transfer arm in the vertical direction, and the predetermined position of the transfer arm is a position where the transfer arm is located in the case of no deviation.

In an example, wafers on the inserts in the elevator simultaneously undergo a pumpdown/vent action in the wafer transfer module.

According to embodiments described herein there is provided a method for transferring a to-be-transferred wafer by the wafer transfer module in a semiconductor manufacturing machine as described above, comprising steps of: receiving, by a control system, a first wafer position signal E1, a second wafer position signal E2, a first transfer arm position signal H1, and a second transfer arm position signal H2; determining the values of the first wafer position signal E1, the second wafer position signal E2, the first transfer arm position signal H1, and the second transfer arm position signal H2; and when an elevator reaches a predetermined position and the value of either the first wafer position signal E1 or the second wafer position signal E2 is 0, or the value of either the first transfer arm position signal H1 or the second transfer arm position signal H2 is 0, controlling the control system to output a transfer arm control signal C, wherein the transfer arm control signal C controls a transfer arm not to move so as not to obtain the to-be-transferred wafer, or controlling the control system to output a transfer arm control signal C, wherein the transfer arm control signal C controls a transfer arm to move so as to obtain the to-be-transferred wafer.

In an example, the control system monitors a change in the values of the first wafer position signal and the second wafer position signal (E1, E2) during movement of the elevator, and if (E1, E2) change from (1, 1) to (1, 0) and then from (1, 0) to (1, 1) and it is determined that the values of the first transfer arm position signal H1 and the second transfer arm position signal H2 are always 1, the control system is controlled to output the transfer arm control signal C, wherein the transfer arm control signal C controls the transfer arm to move so as to obtain the to-be-transferred wafer.

In an example, the control system monitors a change in the values of the first wafer position signal and the second wafer position signal (E1, E2) during movement of the elevator, and if (E1, E2) change from (1, 1) to (1, 0), the control system is controlled to output the transfer arm control signal C, wherein the transfer arm control signal C controls the transfer arm not to move so as not to obtain the to-be-transferred wafer.

In an example, the control system monitors a change in the values of the first wafer position signal and the second wafer position signal (E1, E2) during movement of the elevator, and if (E1, E2) change from (1, 1) to (1, 0), from (1, 0) to (1, 1), and then from (1, 1) to (0, 1), the control system is controlled to output the transfer arm control signal C, wherein the transfer arm control signal C controls the transfer arm not to move so as not to obtain the to-be-transferred wafer.

DETAILED DESCRIPTION OF THE DISCLOSURE

Figure 1:
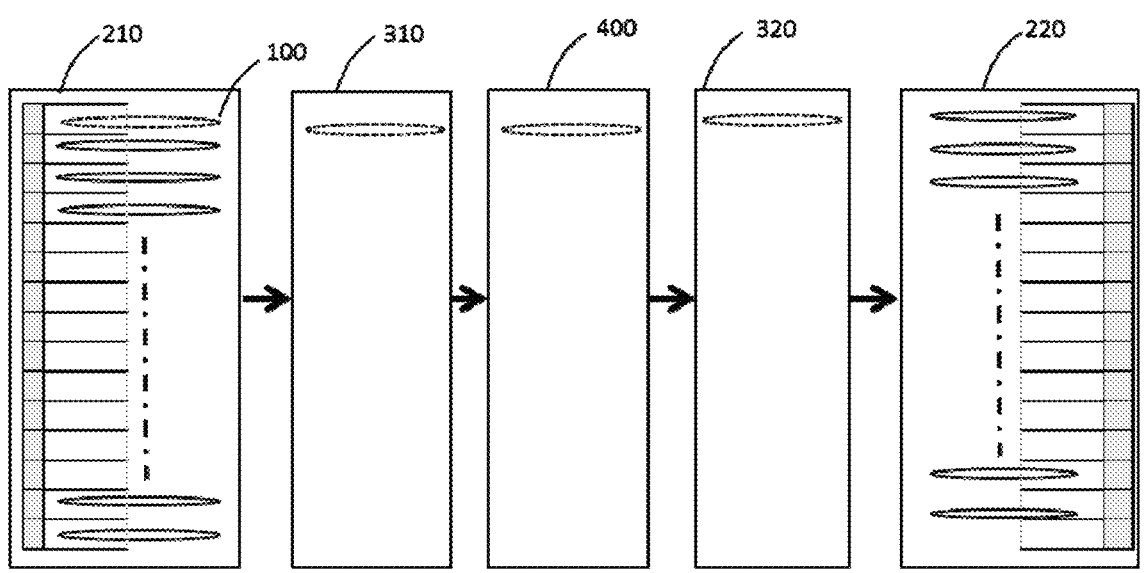
FIG. 1 is a structural schematic diagram of a conventional single wafer transfer-photoresist removal machine.
Figure 2:
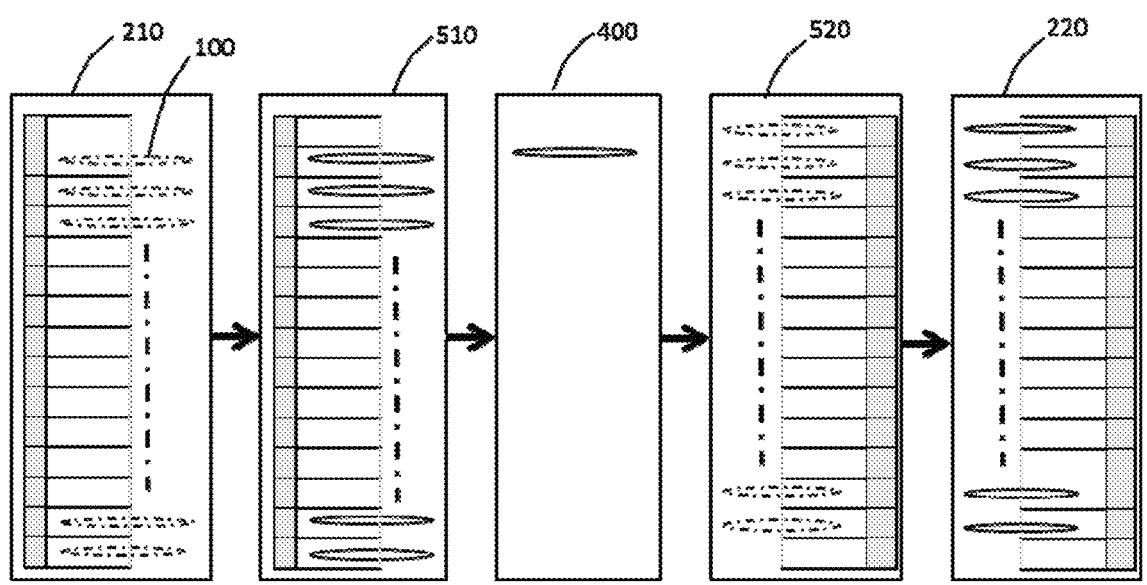
FIG. 2 is a structural schematic diagram of a conventional integrated wafer transfer-photoresist removal machine.
Figure 3A:
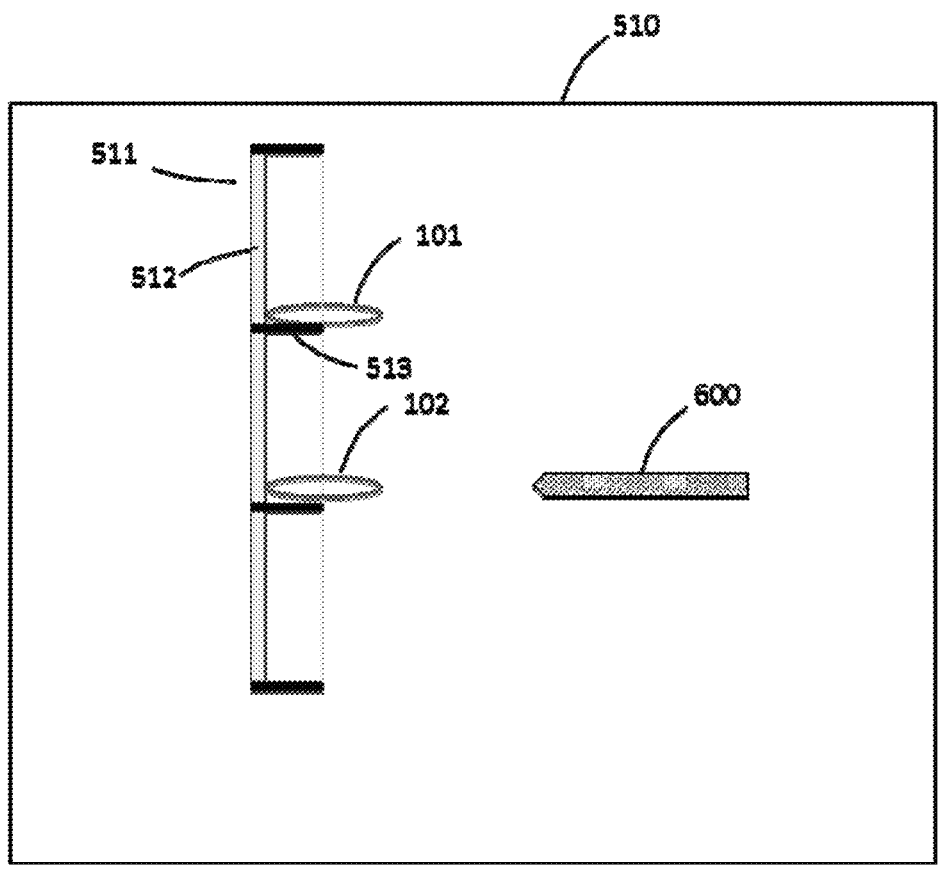
FIGS. 3a-3c are schematic diagrams of a relative positional relationship between an elevator and a transfer arm in a transfer module during a wafer transfer process.
Figure 3B:
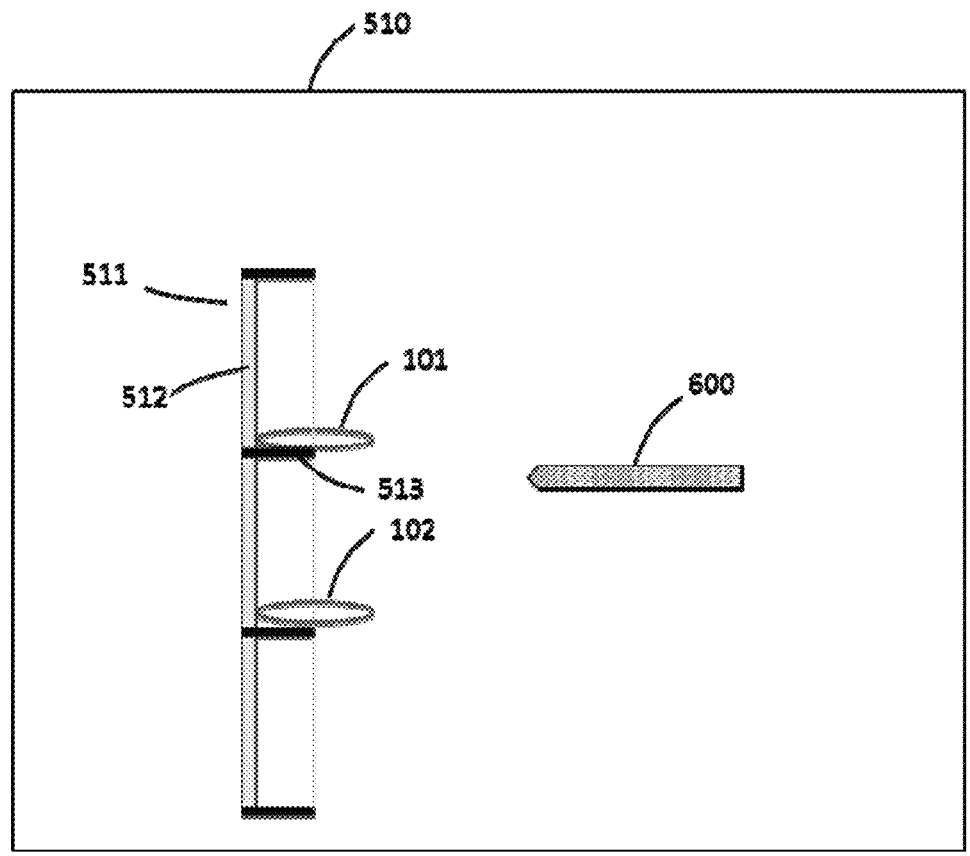
Figure 3C:
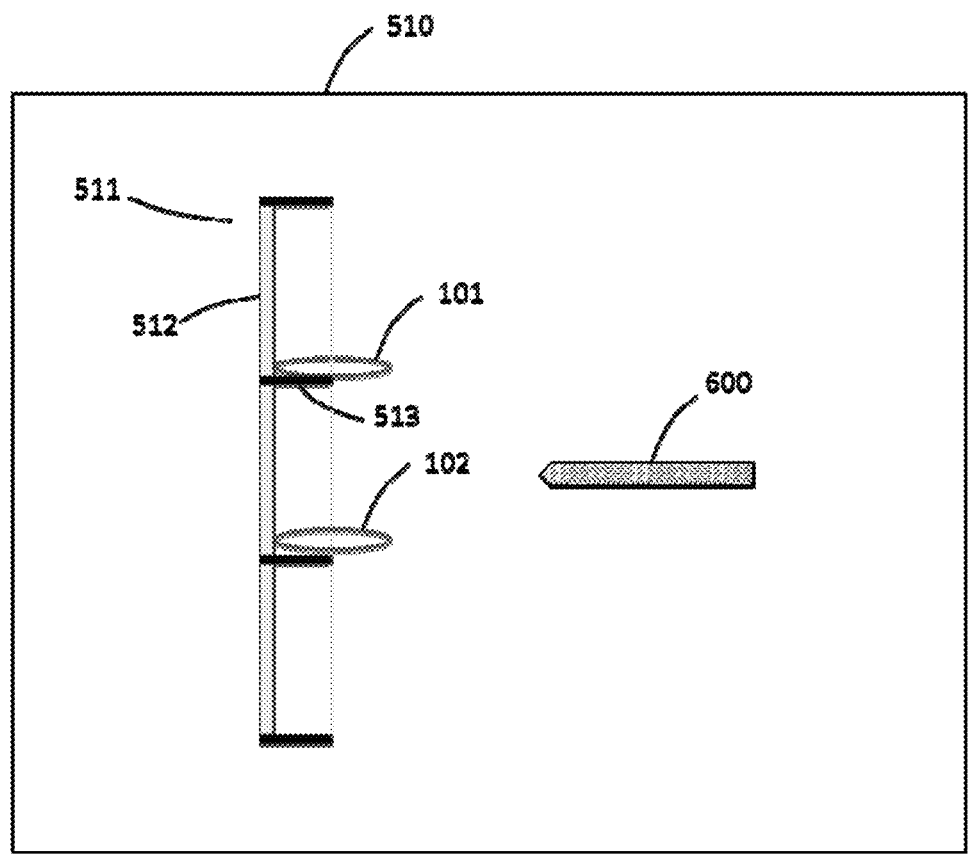

The technical solution of the present application will be clearly and completely described below with reference to the drawings. Obviously, the described embodiments are part of the embodiments of the present application, instead of all of them. Based on the embodiments in the present application, all other embodiments obtained by one skilled in the art without involving any inventive labor shall fall into the protection scope of the present application.

It should be understood that the present application can be implemented in different forms and should not be construed as being limited to the embodiments provided herein. On the contrary, the provision of these embodiments will make the disclosure thorough and complete, and will fully convey the scope of the present application to those skilled in the art. In the drawings, the sizes and relative sizes of layers and regions may be exaggerated for clarity, and the same reference numeral represents the same element throughout. It should be understood that if an element or a layer is referred to as being "on", "adjacent to", "connected to", or "coupled to" another element or layer, it can be directly on the other element or layer, be adjacent thereto, be connected or coupled to the other element or layer, or there may be an intermediate element or layer. In contrast, if an element is referred to as being "directly on", "directly adjacent to", "directly connected to", or "directly coupled to" another element or layer, there is no intermediate element or layer. It should be understood that although the terms first, second, third, etc. may be used to describe various elements, components, regions, layers, and/or portions, these elements, components, regions, layers, and/or portions should not be limited by these terms. These terms are only used to distinguish one element, component, region, layer, or portion from another element, component, region, layer, or portion. Therefore, without departing from the teaching of the present application, the first element, component, region, layer, or portion discussed below may be referred to as a second element, component, region, layer, or portion.

Spatial relationship terms, such as "under", "below", "lower", "beneath", "over", and "upper", etc., can be used herein for convenience of description, so as to describe the relationship between one element or feature shown in the drawing and other element or feature. It should be understood that, in addition to the orientation shown in the drawing, the spatial relationship terms are intended to further include different orientations of a device in use and operation. For example, if the device in the drawing is turned over, then elements or features described as "below other element" or "under other element" or "beneath other element" will be oriented "above" the other element or feature. Therefore, the exemplary terms "below" and "under" may include both upper and lower orientations. The device can be oriented in other direction (rotated by 90 degrees or in other orientation) and spatial terms used herein are interpreted accordingly.

The terms used herein are only intended for describing the specific embodiments, instead of limiting the present application. When used herein, the singular forms "a", "one", and "the/said" are also intended to include plural forms, unless otherwise indicated in the context clearly. It should also be understood that the terms "consisting of" and/or "including", when used in the Description, determine the existence of the described features, integers, steps, operations, elements, and/or components, but do not exclude the existence or addition of one or more other features, integers, steps, operations, elements, components, and/or groups. When used herein, the term "and/or" includes any and all combinations of related items listed.

Figure 4:
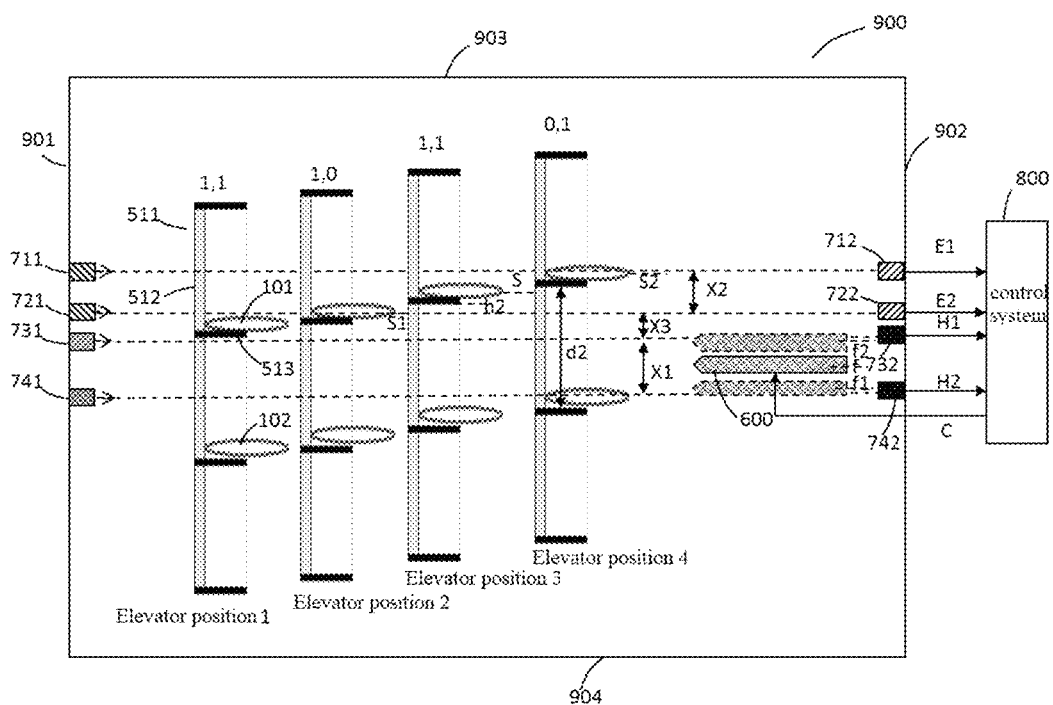
FIG. 4 is a schematic diagram of a wafer transfer module in a semiconductor manufacturing machine according to an embodiment of the present application.

In an embodiment of the present application, a wafer transfer module in a semiconductor manufacturing machine is provided. For details, please refer to FIG. 4, which is a schematic diagram of the wafer transfer module in a semiconductor manufacturing machine according to the embodiment of the present application. Referring to FIG. 4, the wafer transfer module in a semiconductor manufacturing machine includes: a first transfer module sidewall 901 and a second transfer module sidewall 902 opposite to the first transfer module sidewall 901; an elevator 511 located between the first transfer module sidewall 901 and the second transfer module sidewall 902 and used to carry a wafer, wherein the elevator 511 includes an elevator sidewall 512 and a plurality of inserts 513, one end of each of the plurality of inserts 513 is fixed to the elevator sidewall 512 and is in an spaced arrangement along a height direction of the elevator sidewall 512, the other end of each of the plurality of inserts 513 protrudes from the elevator sidewall 512, a portion protruding from the elevator sidewall 512 carries the wafer, and the height direction of the elevator sidewall 512 is consistent with an extension direction of the first transfer module sidewall 901 and the second transfer module sidewall 902; a first transmitter 711 and a first receiver 712, wherein the first transmitter 711 is disposed on the first transfer module sidewall 901, the first receiver 712 is disposed on the second transfer module sidewall 902, and the first receiver 712 is positioned opposite the first transmitter 711 such that in a case of no obstruction between the first receiver 712 and the first transmitter 711, the first receiver 712 can receive a signal transmitted by the first transmitter 711; a second transmitter 721 and a second receiver 722, wherein the second transmitter 721 is disposed on the first transfer module sidewall 901, the second receiver 722 is disposed on the second transfer module sidewall 902, the second receiver 722 is positioned opposite the second transmitter 721 such that in a case of no obstruction between the second receiver 722 and the second transmitter 721, the second receiver 722 can receive a signal transmitted by the second transmitter 721, the first transmitter 711 and the first receiver 712 corresponding thereto and the second transmitter 721 and the second receiver 722 corresponding thereto are used to monitor the position of a to-be-transferred wafer in a vertical direction, and according to a position change of the to-be-transferred wafer in the vertical direction, the first receiver 712 outputs a first wafer position signal E1 and the second receiver 722 outputs a second wafer position signal E2, wherein the position change of the to-be-transferred wafer in the vertical direction is implemented by means of movement of the elevator 511 in the vertical direction; a third transmitter 731 and a third receiver 732, wherein the third transmitter 731 is disposed on the first transfer module sidewall 901, the third receiver 732 is disposed on the second transfer module sidewall 902, and the third receiver 732 is positioned opposite the third transmitter 731 such that in a case of no obstruction between the third receiver 732 and the third transmitter 731, the third receiver 732 can receive a signal transmitted by the third transmitter 731; a fourth transmitter 741 and a fourth receiver 742, wherein the fourth transmitter 741 is disposed on the first transfer module sidewall 901, the fourth receiver 742 is disposed on the second transfer module sidewall 902, the fourth receiver 742 is positioned opposite the fourth transmitter 741 such that in a case of no obstruction between the fourth receiver 742 and the fourth transmitter 741, the fourth receiver 742 can receive a signal transmitted by the fourth transmitter 741, the third transmitter 731 and the third receiver 732 corresponding thereto and the fourth transmitter 741 and the fourth receiver 742 corresponding thereto are used to monitor the position of a transfer arm 600 used to transfer the wafer in the vertical direction, and according to a position change of the transfer arm 600 in the vertical direction, the third receiver 732 outputs a first transfer arm position signal H1 and the fourth receiver 742 outputs a second transfer arm position signal H2; and a control system 800 that receives the first wafer position signal E1, the second wafer position signal E2, the first transfer arm position signal H1, and the second transfer arm position signal H2 and outputs a transfer arm control signal C according to the first wafer position signal E1, the second wafer position signal E2, the first transfer arm position signal H1, and the second transfer arm position signal H2, to control whether the transfer arm 600 moves to obtain the to-be-transferred wafer, wherein the vertical direction is the height direction of the elevator sidewall 511.

Referring to FIG. 4, in an example, during transfer of the to-be-transferred wafer 101, the elevator 511 gradually moves upward in the vertical direction to move the to-be-transferred wafer 101 to a wafer target position S, so that the transfer arm 600 transfers the to-be-transferred wafer 101 in a case of no deviation (no vertical deviation), i.e., without scratching the to-be-transferred wafer 101 nor scratching a wafer 102 on a lower side adjacent to the to-be-transferred wafer 101. When the to-be-transferred wafer 101 reaches the wafer target position S, the elevator 511 gradually moves from elevator position 1 to elevator position 2, and then gradually moves to elevator position 3, wherein the elevator position 3 is a predetermined position of the elevator. Referring to FIG. 4, at the elevator position 1, the signals transmitted by the first transmitter 711 and the second transmitter 721 both are unobstructed, the first receiver 712 and the second receiver 722 can respectively receive the signals transmitted by the first transmitter 711 and the second transmitter 721, and therefore, the values of the first wafer position E1 and the second wafer position signal E2 both are 1. At the elevator position 2, the signal transmitted by the first transmitter 711 is unobstructed, the first receiver 712 receives the signal transmitted by the first transmitter 711, and therefore, the value of the first wafer position signal E1 is 1; the signal transmitted by the second transmitter 721 is obstructed by the wafer, the second receiver 722 cannot receive the signal transmitted by the second transmitter 721, and therefore, the value of the second wafer position signal E2 is 0. At the elevator position 3, the signals transmitted by the first transmitter 711 and the second transmitter 721 both are unobstructed, the first receiver 712 and the second receiver 722 can respectively receive the signals transmitted by the first transmitter 711 and the second transmitter 721, and therefore, the values of the first wafer position signal E1 and the second wafer position signal E2 both are 1. That is, if (E1, E2) change from (1, 1) to (1, 0) and then from (1, 0) to (1, 1), it is considered that the to-be-transferred wafer 101 is moved to the wafer target position S, and the wafer transfer can be performed; and if the values of the first transfer arm position signal H1 output by the third receiver 732 and the second transfer arm position signal H2 output by the fourth receiver 742 are always 1, it is considered that the transfer arm 600 does not undergo a deviation, and in this case, the control system 800 outputs the transfer arm control signal C to the transfer arm 600 according to the first wafer position signal E1, the second wafer position signal E2, the first transfer arm position signal H1, and the second transfer arm position signal H2, to control the transfer arm 600 to obtain the to-be-transferred wafer 101.

Similarly, referring to FIG. 4, in an example, during transfer of the to-be-transferred wafer 101, if the elevator 511 moves to the elevator position 2, as described above, the final position of the to-be-transferred wafer 101 does not reach the wafer target position S and merely reaches a first position S1 lower than the wafer target position S, and the values of the first wafer position signal and the second wafer position signal (E1, E2) change from (1, 1) to (1, 0), in which case it is considered that the to-be-transferred wafer 101 is not moved to the wafer target position S and the elevator position is too low, so the wafer transfer cannot be performed. In this case, regardless of the values of the first transfer arm position signal H1 and the second transfer arm position signal H2, the transfer arm control signal C output by the control system 800 controls the transfer arm 600 not to move so as not to obtain the to-be-transferred wafer 101.

Similarly, referring to FIG. 4, in an example, during transfer of the to-be-transferred wafer 101, if the elevator 511 moves to the elevator position 4, as described above, the final position of the to-be-transferred wafer 101 does not reach the wafer target position S and reaches a second position S2 higher than the wafer target position S, and the values of the first wafer position signal and the second wafer position signal (E1, E2) change from (1, 1) to (1, 0), from (1, 0) to (1, 1), and then from (1, 1) to (0, 1), in which case it is considered that the to-be-transferred wafer 101 is not moved to the wafer target position S and the elevator position is too high, so the wafer transfer cannot be performed. In this case, regardless of the values of the first transfer arm position signal H1 and the second transfer arm position signal H2, the transfer arm control signal C output by the control system 800 controls the transfer arm 600 not to move so as not to obtain the to-be-transferred wafer 101.

As described above, as long as the value of either the first wafer position signal E1 or the second wafer position signal E2 is 0 when the elevator reaches the predetermined position (i.e., when the elevator stops moving), which means that the elevator position is too high or too high, the transfer arm control signal C output by the control system 800 controls the transfer arm 600 not to move so as not to obtain the to-be-transferred wafer 101.

The transfer arm 600 moves horizontally during operation to obtain the to-be-transferred wafer from the insert 513 or to place the wafer on the insert 513. The transfer arm 600 generally does not deviate from the vertical direction. However, as the machine use time increases, the transfer arm 600 may deviate from the vertical direction, in which case even if the to-be-transferred wafer 101 is moved to the wafer target position S, the transfer arm 600 may still scratch the wafer. Specifically, continuing to refer to FIG. 4, when the transfer arm 600 is located at a predetermined position f, i.e., a position where the transfer arm 600 is located in the case of no deviation, the transfer arm 600 neither obstructs the signal transmitted by the third transmitter 731 nor does it obstruct the signal transmitted by the fourth transmitter 741, that is, the values of the first transfer arm position signal H1 and the second transfer arm position signal H2 both are 1. When the transfer arm 600 is located at a position f1, the transfer arm 600 obstructs the signal transmitted by the fourth transmitter 741 and does not obstruct the signal transmitted by the third transmitter 731, that is, the value of the first transfer arm position signal H1 is 1, and the value of the second transfer arm position signal H2 is 0, in which case the position of the transfer arm 600 is too low so that the transfer arm 600 cannot move to obtain the to-be-transferred wafer. When the transfer arm 600 is located at a position f2, the transfer arm 600 obstructs the signal transmitted by the third transmitter 731 and does not obstruct the signal transmitted by the fourth transmitter 741, that is, the value of the second transfer arm position signal H2 is 1, and the value of the first transfer arm position signal H1 is 0, in which case the position of the transfer arm 600 is too high so that the transfer arm 600 cannot move to obtain the to-be-transferred wafer. That is, as long as the value of either the first transfer arm position signal H1 or the second transfer arm position signal H2 is 0, which means that the position of the transfer arm 600 is too high or too low, the transfer arm control signal C output by the control system 800 controls the transfer arm 600 not to move so as not to obtain the to-be-transferred wafer 101.

Referring to FIG. 4, the wafer transfer module 900 further includes a third transfer module sidewall 903 and a fourth transfer module sidewall 904 opposite to the third transfer module sidewall 903. The wafer transfer module 900 with a box structure is formed by the first transfer module sidewall 901, the second transfer module sidewall 902, the third transfer module sidewall 903, and the fourth transfer module sidewall 904.

Referring to FIG. 4, if the thickness of the insert 513 is d1, a distance between two adjacent inserts 513 is d2, the thickness of the transfer arm 600 is d3, the thickness of the wafer is d4, and an acceptable vertical tolerance for the position of the transfer arm is h1, then a distance X1 between the third transmitter 731 and the fourth transmitter 741 is d3+2*h1. In some examples, a vertical distance between the third transmitter 731 and the transfer arm 600 is equal to a vertical distance between the fourth transmitter 741 and the transfer arm 600, in both cases being represented by h1. If an acceptable vertical tolerance for the position of the to-be-transferred wafer with respect to the wafer target position S is h2, a distance X2 between the first transmitter 711 and the second transmitter 721 is d4+d1+2*h2. In some examples, a vertical distance between the first transmitter 711 and the wafer target position S is equal to a vertical distance between the second transmitter 721 and wafer target position S, in both cases being represented by h2. A distance X3 between the second transmitter 721 and the third transmitter 731 is (d2−d4)/2−d3/2−h1−h2, the first transmitter 711 is located on an upper side of the wafer target position S in the vertical direction, the second transmitter 721 is located on a lower side of the wafer target position S in the vertical direction, the third transmitter 731 is located on an upper side of the predetermined position of the transfer arm 600 in the vertical direction, and the fourth transmitter 741 is located on a lower side of the predetermined position of the transfer arm 600 in the vertical direction. In an embodiment, if the thickness d1 of the insert 513 is about 1 mm, the distance d2 between two adjacent inserts 513 is about 10 mm, the thickness d3 of the transfer arm 600 is about 2 mm, the thickness d4 of the wafer is about 0.8 mm, and the acceptable vertical tolerance h1 for the position of the transfer arm 600 is about 1 mm, then the distance X1 between the third transmitter 731 and the fourth transmitter 741 is d3+2*h1=2 mm+2*1 mm=4 mm. In some examples, the vertical distance between the third transmitter 731 and the transfer arm 600 is equal to the vertical distance between the fourth transmitter 741 and the transfer arm 600, in both cases being about 1 mm. If the acceptable vertical tolerance h2 for the position of the to-be-transferred wafer with respect to the wafer target position S is about 1 mm, the distance X2 between the first transmitter 711 and the second transmitter 721 is d4+d1+2*h2=0.8 mm+1 mm+2*1 mm=3.8 mm. In some examples, the vertical distance between the first transmitter 711 and the wafer target position S is equal to the vertical distance between the second transmitter 721 and wafer target position S, in both cases being about 1 mm. The distance X3 between the second transmitter 721 and the third transmitter 731 is (d2−d4)/2−d3/2−h1−h2=(10 mm−0.8 mm)/2−2 mm/2−1 mm−1 mm=1.6 mm, the first transmitter 711 is located on the upper side of the wafer target position S in the vertical direction, the second transmitter 721 is located on the lower side of the wafer target position S in the vertical direction, the third transmitter 731 is located on the upper side of the predetermined position of the transfer arm 600 in the vertical direction, and the fourth transmitter 741 is located on the lower side of the predetermined position of the transfer arm 600 in the vertical direction. Referring to FIG. 4, when the to-be-transferred wafer 101 is located at the wafer target position S, a vertical distance between the insert carrying the to-be-transferred wafer 101 and the second transmitter 721 is h2, which is about 1 mm.

In an embodiment, wafers on the inserts 513 in the elevator 511 simultaneously undergo a pumpdown/vent action in the wafer transfer module, that is, the wafer transfer module is an integrated wafer transfer module.

In an embodiment, the wafer transfer module is a wafer transfer module in any machine that needs to transfer wafers, such as a wafer transfer module in a photoresist removal machine.

In an embodiment, the first transmitter 711, the second transmitter 721, the third transmitter 731, and the fourth transmitter 741 are optical transmitters; and the first receiver 712, the second receiver 722, the third receiver 732, and the fourth receiver 742 are optical receivers.

In an embodiment of the present application, a method for transferring a to-be-transferred wafer by the wafer transfer module in a semiconductor manufacturing machine described above is further provided. The method includes the following steps: a control system 800 receives a first wafer position signal E1, a second wafer position signal E2, a first transfer arm position signal H1, and a second transfer arm position signal H2, and determines the values of the first wafer position signal E1, the second wafer position signal E2, the first transfer arm position signal H1, and the second transfer arm position signal H2; and when an elevator 511 reaches a predetermined position and the value of either the first wafer position signal E1 or the second wafer position signal E2 is 0, or the value of either the first transfer arm position signal H1 or the second transfer arm position signal H2 is 0, the control system 800 is controlled to output a transfer arm control signal C, wherein the transfer arm control signal C controls a transfer arm 600 not to move so as not to obtain the to-be-transferred wafer 101.

More specifically, in an embodiment, the control system 800 monitors a change in the values of the first wafer position signal and the second wafer position signal (E1, E2) during movement of the elevator 511, and if (E1, E2) change from (1, 1) to (1, 0) and then from (1, 0) to (1, 1) and it is determined that the values of the first transfer arm position signal H1 and the second transfer arm position signal H2 are always 1, the control system 800 is controlled to output the transfer arm control signal C, wherein the transfer arm control signal C controls the transfer arm 600 to move so as to obtain the to-be-transferred wafer 101, thereby moving the to-be-transferred wafer 101 out from the elevator 511. In an embodiment, the control system 800 monitors a change in the values of the first wafer position signal and the second wafer position signal (E1, E2) during movement of the elevator 511, and if (E1, E2) change from (1, 1) to (1, 0), the control system 800 is controlled to output the transfer arm control signal C, wherein the transfer arm control signal C controls the transfer arm 600 not to move so as not to obtain the to-be-transferred wafer 101. In an embodiment, the control system 800 monitors a change in the values of the first wafer position signal and the second wafer position signal (E1, E2) during movement of the elevator 500, and if (E1, E2) change from (1, 1) to (1, 0), from (1, 0) to (1, 1), and then from (1, 1) to (0, 1), the control system 800 is controlled to output the transfer arm control signal C, wherein the transfer arm control signal C controls the transfer arm 600 not to move so as not to obtain the to-be-transferred wafer 101; or the control system 800 is controlled to output the transfer arm control signal C, wherein the transfer arm control signal C controls the transfer arm 600 to move so as to obtain the to-be-transferred wafer 101.

More specifically, in an embodiment, the control system 800 monitors the values of the first transfer arm position signal H1 and the second transfer arm position signal H2, and if the value of either the first transfer arm position signal H1 or the second transfer arm position signal H2 is 0, the transfer arm control signal C controls the transfer arm 600 not to move so as not to obtain the to-be-transferred wafer 101.

As stated above, two sets of transmitter/receivers are provide on the sidewalls of the wafer transfer module to monitor the travel position of the elevator, two sets of transmitter/receivers are provide on the sidewalls of the wafer transfer module to monitor the position of the transfer arm, the signal received by the receiver is transmitted to the control system such that the control system determines, according to the travel position of the elevator and the transfer arm position, whether the transfer arm can obtain the to-be-transferred wafer, thereby preventing the problem of a wafer scratch caused by an elevator position deviation or a transfer arm position deviation.

Finally, it should be noted that the above embodiments are used only for illustration of the technical solutions of the present application, but not for limitation. Although the present application has been described in detail with reference to the foregoing embodiments, those skilled in the art should understand that, they can still modify the technical solutions described in the foregoing embodiments, or make equivalent replacement for some or all of the technical features therein; and these modifications or replacements do not cause the essence of the corresponding technical solutions to deviate from the scope of the technical solutions in the embodiments of the present application.

What is claimed is:
1. A wafer transfer module in a semiconductor manufacturing machine, comprising:
   a first transfer module sidewall and a second transfer module sidewall opposite to the first transfer module sidewall;
   an elevator located between the first transfer module sidewall and the second transfer module sidewall and used to carry a wafer, wherein the elevator comprises an elevator sidewall and a plurality of inserts, one end of each of the plurality of inserts is fixed to the elevator sidewall and is in a spaced arrangement along a height direction of the elevator sidewall, the other end of each of the plurality of inserts protrudes from the elevator sidewall, a portion protruding from the elevator sidewall carries the wafer, and the height direction of the elevator sidewall is consistent with an extension direction of the first transfer module sidewall and the second transfer module sidewall;
   a first transmitter and a first receiver, wherein the first transmitter is disposed on the first transfer module sidewall, the first receiver is disposed on the second transfer module sidewall, and the first receiver is positioned opposite the first transmitter such that in a case of no obstruction between the first receiver and the first transmitter, the first receiver can receive a signal transmitted by the first transmitter;

a second transmitter and a second receiver, wherein the second transmitter is disposed on the first transfer module sidewall, the second receiver is disposed on the second transfer module sidewall, the second receiver is positioned opposite the second transmitter such that in a case of no obstruction between the second receiver and the second transmitter, the second receiver can receive a signal transmitted by the second transmitter, the first transmitter and the first receiver corresponding thereto and the second transmitter and the second receiver corresponding thereto are used to monitor the position of a to-be-transferred wafer in a vertical direction, and according to a position change of the to-be-transferred wafer in the vertical direction, the first receiver outputs a first wafer position signal E1 and the second receiver outputs a second wafer position signal E2, wherein the position change of the to-be-transferred wafer in the vertical direction is implemented by means of movement of the elevator in the vertical direction;

a third transmitter and a third receiver, wherein the third transmitter is disposed on the first transfer module sidewall, the third receiver is disposed on the second transfer module sidewall, and the third receiver is positioned opposite the third transmitter such that in a case of no obstruction between the third receiver and the third transmitter, the third receiver can receive a signal transmitted by the third transmitter;

a fourth transmitter and a fourth receiver, wherein the fourth transmitter is disposed on the first transfer module sidewall, the fourth receiver is disposed on the second transfer module sidewall, the fourth receiver is positioned opposite the fourth transmitter such that in a case of no obstruction between the fourth receiver and the fourth transmitter, the fourth receiver can receive a signal transmitted by the fourth transmitter, the third transmitter and the third receiver corresponding thereto and the fourth transmitter and the fourth receiver corresponding thereto are used to monitor the position of a transfer arm used to transfer the wafer in the vertical direction, and according to a position change of the transfer arm in the vertical direction, the third receiver outputs a first transfer arm position signal H1 and the fourth receiver outputs a second transfer arm position signal H2; and a control system that receives the first wafer position signal E1, the second wafer position signal E2, the first transfer arm position signal H1, and the second transfer arm position signal H2 and outputs a transfer arm control signal C according to the first wafer position signal E1, the second wafer position signal E2, the first transfer arm position signal H1, and the second transfer arm position signal H2, to control whether the transfer arm moves to obtain the to-be-transferred wafer, wherein the vertical direction is the height direction of the elevator sidewall.

2. The wafer transfer module in the semiconductor manufacturing machine according to claim 1, wherein the wafer transfer module further comprises a third transfer module sidewall and a fourth transfer module sidewall opposite to the third transfer module sidewall, and the wafer transfer module with a box structure is formed by the first transfer module sidewall, the second transfer module sidewall, the third transfer module sidewall, and the fourth transfer module sidewall.

3. The wafer transfer module in the semiconductor manufacturing machine according to claim 1, wherein if a thickness of the insert is d1, a distance between two adjacent inserts is d2, a thickness of the transfer arm is d3, a thickness of the wafer is d4, and an acceptable vertical tolerance for the position of the transfer arm is h1, then a distance X1 between the third transmitter and the fourth transmitter is d3+2*h1.

4. The wafer transfer module in the semiconductor manufacturing machine according to claim 3, wherein if an acceptable vertical tolerance for the position of the to-be-transferred wafer with respect to a wafer target position S is h2, a distance X2 between the first transmitter and the second transmitter is d4+d1+2*h2, and the wafer target position S is a position where the to-be-transferred wafer can be transferred in the case of no deviation of the transfer arm, without a scratch on the to-be-transferred wafer and on a wafer on a lower side adjacent to the to-be-transferred wafer.

5. The wafer transfer module in the semiconductor manufacturing machine according to claim 4, wherein a distance X3 between the second transmitter and the third transmitter is (d2-d4)/2-d3/2-h1-h2, the first transmitter is located on an upper side of the wafer target position S in the vertical direction, the second transmitter is located on a lower side of the wafer target position S in the vertical direction, the third transmitter is located on an upper side of a predetermined position of the transfer arm in the vertical direction, the fourth transmitter is located on a lower side of the predetermined position of the transfer arm in the vertical direction, and the predetermined position of the transfer arm is a position where the transfer arm is located in the case of no deviation.

6. The wafer transfer module in the semiconductor manufacturing machine according to claim 1, wherein wafers on the inserts in the elevator simultaneously undergo a pump-down/vent action in the wafer transfer module.

* * * * *